US010365639B2

(12) United States Patent
Ghadar et al.

(10) Patent No.: US 10,365,639 B2
(45) Date of Patent: Jul. 30, 2019

(54) FEATURE SELECTION AND AUTOMATED PROCESS WINDOW MONITORING THROUGH OUTLIER DETECTION

(71) Applicant: KLA-Tencor Corporation, Milpitas, CA (US)

(72) Inventors: Shabnam Ghadar, Sunnyvale, CA (US); Sina Jahanbin, San Jose, CA (US); Himanshu Vajaria, San Jose, CA (US); Bradley Ries, San Jose, CA (US)

(73) Assignee: KLA-Tencor Corporation, Milpitas, CA (US)

(*) Notice: Subject to any disclaimer, the term of this patent is extended or adjusted under 35 U.S.C. 154(b) by 349 days.

(21) Appl. No.: 15/248,523

(22) Filed: Aug. 26, 2016

(65) Prior Publication Data
US 2017/0192411 A1 Jul. 6, 2017

Related U.S. Application Data

(60) Provisional application No. 62/275,700, filed on Jan. 6, 2016.

(51) Int. Cl.
G05B 19/408 (2006.01)
G06N 5/02 (2006.01)
G05B 19/418 (2006.01)
H01L 21/66 (2006.01)
G06N 20/00 (2019.01)

(52) U.S. Cl.
CPC ....... G05B 19/41875 (2013.01); G06N 20/00 (2019.01); H01L 22/12 (2013.01); H01L 22/20 (2013.01); G05B 2219/37224 (2013.01); Y02P 90/22 (2015.11)

(58) Field of Classification Search
CPC .................................. G05B 19/41875
See application file for complete search history.

(56) References Cited

U.S. PATENT DOCUMENTS

| 6,292,582 B1* | 9/2001 | Lin | G01N 21/95607 257/E23.179 |
| 6,483,938 B1* | 11/2002 | Hennessey | G01N 21/95607 257/E21.525 |
| 9,436,985 B1* | 9/2016 | Kuan | H01J 37/28 |
| 9,865,512 B2* | 1/2018 | Jayaraman | H01L 22/12 |

(Continued)

FOREIGN PATENT DOCUMENTS

JP 2001156135 6/2001

OTHER PUBLICATIONS

ISA/KR, International Search Report for PCT/US2017/012382 dated Apr. 19, 2017.

(Continued)

Primary Examiner — Moazzam Hossain
(74) Attorney, Agent, or Firm — Hodgson Russ LLP

(57) ABSTRACT

Feature extraction and classification is used for process window monitoring. A classifier, based on combinations of metrics of masked die images and including a set of significant combinations of one or more segment masks, metrics, and wafer images, is capable of detecting a process non-compliance. A process status can be determined using a classifier based on calculated metrics. The classifier may learn from nominal data.

20 Claims, 8 Drawing Sheets

(56) References Cited

U.S. PATENT DOCUMENTS

| | | | |
|---|---|---|---|
| 2008/0187212 A1* | 8/2008 | Obara | G06T 7/001 382/149 |
| 2008/0250384 A1* | 10/2008 | Duffy | G03F 7/70525 716/55 |
| 2009/0226057 A1* | 9/2009 | Mashiach | G06T 5/008 382/128 |
| 2011/0274342 A1* | 11/2011 | Maeda | G01N 21/95623 382/149 |
| 2013/0163851 A1 | 6/2013 | Dalla-Torre et al. | |
| 2013/0188859 A1 | 7/2013 | Luo et al. | |
| 2014/0114597 A1 | 4/2014 | Chen et al. | |
| 2015/0234379 A1 | 8/2015 | Vajaria et al. | |
| 2016/0300125 A1* | 10/2016 | Barker | G06K 9/6256 |
| 2016/0371826 A1* | 12/2016 | Vajaria | G06T 7/11 |

OTHER PUBLICATIONS

ISA/KR, Written Opinion of the International Searching Authority for PCT/US2017/012382 dated Apr. 19, 2017

Bjorkholm, Euv Lithography—The Successor to Optical Lithography?, Intel Technology Journal, pp. 1-8, Q3 1998.

Mulkens, et al., Defects, Overlay and Focus Performance Improvements with Five Generations of Immersion Exposure Systems, Proc. of SPIE, vol. 6250, p. 652005, pp. 1-11, Mar. 19, 2007.

Shiode, et al., A novel focus monitoring method using double side chrome mask, Proc. of SPIE, vol. 5754, pp. 303-313, May 12, 2005.

Nikon, Auto Macro Inspection Technology, webpage, http://www.nikon.com/about/technology/rd/core/optics/wafer/index.htm, Jan. 2008.

KLA-Tencor, All-Surface Wafer Defect Inspection, Metrology and Review Cluster Tool, webpage, http://www.kla-tencor.com/Front-End-Defect-Inspection/circl.html, Apr. 23, 2012.

Sezgin, et al., Survey over image thresholding techniques and quantitative performance evaluation, Journal of Electronic Imaging, vol. 13, No. 1, pp. 146-165, Jan. 2004.

Liao, et al., A Fast Algorithm for Multilevel Thresholding, Journal of Information Science and Engineering, vol. 17, pp. 713-727, 2001.

Wang, GMM-Based Hidden Markov Random Field for Color Image and 3D Volume Segmentation, pp. 1-8, Dec. 18, 2012.

Amer, et al., Enhancing One-class Support Vector Machines for Unsupervised Anomaly Detection, 13 Proceedings of the ACM SIGKDD Workshop on Outlier Detection and Description, pp. 1-8, Aug. 11, 2013.

Scholkopf, et al., Estimating the support of a high-dimensional distribution, Neural Computation, vol. 13, No. 7, pp. 1443-1471, Jul. 1, 2001.

* cited by examiner

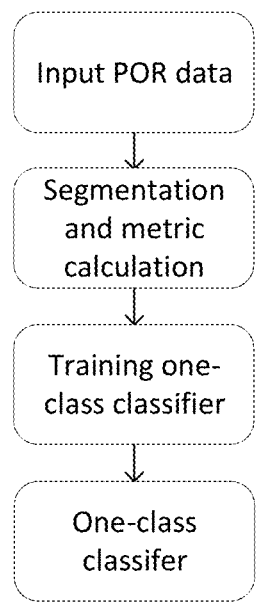 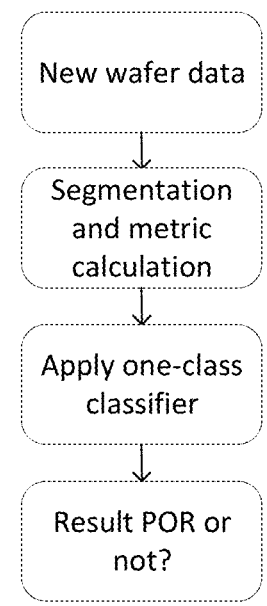
FIG. 3A                    FIG. 3B

FEATURE SELECTION AND AUTOMATED PROCESS WINDOW MONITORING THROUGH OUTLIER DETECTION

CROSS-REFERENCE TO RELATED APPLICATIONS

This application claims priority to the provisional patent application filed Jan. 6, 2016 and assigned U.S. App. No. 62/275,700, the disclosure of which is hereby incorporated by reference.

FIELD OF THE DISCLOSURE

The disclosure relates to monitoring and control of wafer manufacturing processes.

BACKGROUND OF THE DISCLOSURE

Semiconductor devices such as logic and memory devices are typically fabricated by a sequence of processing steps applied to a substrate or wafer. The various features and multiple structural levels of the semiconductor devices are formed by these processing steps. For example, lithography is a semiconductor fabrication process that involves generating a pattern on a semiconductor wafer. Additional examples of semiconductor fabrication processes include, but are not limited to, chemical-mechanical polishing (CMP), etch, deposition, and ion implantation. Multiple semiconductor devices may be fabricated on a single semiconductor wafer and then separated into individual semiconductor devices.

Inspection processes are used at various steps during a semiconductor manufacturing process to detect defects on wafers to promote higher yield. As design rules and process windows continue to shrink in size, inspection systems are required to capture a wider range of physical defects on wafer surfaces while maintaining high throughput.

Wafer manufacturing process control is typically performed based on low wafer sampling using a slow, but sensitive, inspection tool, followed by review using a scanning electron microscope (SEM). In other cases, process monitoring and control is achieved by way of a learning-based method where a process engineer learns how long the process tool can be used before requiring maintenance. This process engineer-based approach is prone to random failures because there is no in-line feedback or older automated classifiers. In both of these previous techniques, there is no early detection of process tool issues. Issues are only detected once a process tool has become problematic and creates defects that can be observed on inspection. Additionally, these techniques are slow, and, therefore, wafer sampling is low. Such techniques create large overhead, such as for process tools that have a one or two day preventative maintenance cycle. These techniques also can cause reduced yield, which negatively impacts foundries that may only have a few lots per device to manufacture. Furthermore, normal class may be more common on inspected wafers, which makes detection difficult. Outliers typically are infrequent and may manifest themselves in unexpected combinations.

In practice, semiconductor processes are typically subject to multiple parameters that may have interdependence among each other. Hence, for effective process optimization, it is necessary to identify which parameters are the most significant in determining the yield of a process, and then to determine the optimal range of values (or "process window") for each parameter. Furthermore, it is desirable to make this determination as early as possible in the semiconductor manufacturing process.

Critical dimensions in semiconductor manufacturing keep shrinking as 14 nm and 7 nm microarchitecture become more prevalent. However, the resolution capability is still $\lambda/NA$, where $\lambda$ is imaging wavelength and NA is numerical aperture. To achieve higher resolution either $\lambda$ is reduced or numerical aperture (NA) is increased. Extreme ultraviolet (EUV) lithography has been suggested to reduce the wavelength, but its economic viability has yet to be achieved. Therefore, lenses with high NA are used for better imaging, resulting in reduced depth of focus (DOF) as DOF is inversely proportional to $NA^2$. Consequently, semiconductor manufacturing is much more sensitive to process variation. This impacts the yield since systematic patterning defects increase as a result of higher sensitivity to focus and dose. Even though scanner precision in controlling the process window is improving, other process constraints can affect focus and exposure. Therefore, a market for real-time technology for monitoring process window on production wafers exists. In other words, process window in a lithographic process is a collection of acceptable range foci and exposures that result in electronics circuits to be manufactured with desired specifications.

In current semiconductor fabrication techniques, a process window is optimized for only one parameter at a time, and the tradeoff between results of variations are not well accounted for. For example, if a critical dimension process window is optimized, this will require a shift in the oxide thickness process window. However, if the oxide thickness process window is to be optimized, the critical dimension process window will then shift. This can adversely affect the overall production yield.

Technologies for process window monitoring tend to monitor the tool performance and its stability, and, thus, catch process variation. However, these technologies cannot detect process fluctuations on product wafers due to the impact of other processes.

Accordingly, there is a need for high-throughput process monitoring and control that is capable of detecting non-compliance based on previously unknown patterns.

BRIEF SUMMARY OF THE DISCLOSURE

In a first embodiment, a method for generating a classifier is provided. The method comprises receiving at least one wafer image, wherein the wafer image comprises a set of die images; generating, using a processor, a median die of a wafer and a standard deviation of the wafer based on the set of die images; generating, using the processor, a segment mask based on the median die of the wafer and based on the standard deviation of the wafer; applying, using the processor, the segment mask to each of the die images to create a plurality of segmented die images for each of the die images; representing, using the processor, each of the dies with a vector of feature values; calculating, using the processor, die metrics for each of the die images based on the vector; and identifying, using the processor, one or more statistically significant combinations of the die metrics, the segment mask, and the wafer image to generate a classifier.

The die metrics can include mean and standard deviation for each of the segmented die images. The die metrics can include mean and standard deviation for the segmented die image of a gradient image of the die. The mean and the standard deviation for each of the segmented die images can include at least one of a Y-gradient or an X-gradient.

The classifier can be a one-class Mahalanobis classifier or a one-class Support Vector Machine (SVM) classifier.

In a second embodiment, a process control method is provided. The method comprises receiving a pre-determined classifier capable of detecting a process non-compliance, wherein the classifier is based on combinations of metrics of masked die images; receiving a wafer image comprising a set of die images; masking the wafer image using a segment mask; representing, using a processor, each of the dies in the set of die images with a vector of feature values; calculating, using the processor, die metrics for each of the dies; calculating, using the processor, a metric of the wafer image based on a corresponding combination of the segment mask and the die metrics from the classifier; and determining, using the processor, a process status using the classifier based on the calculated metrics.

The classifier can be a one-class Mahalanobis classifier or a one-class Support Vector Machine (SVM) classifier.

The die metrics can include mean and standard deviation for a segmented die image. The die metrics can include mean and standard deviation for the segmented die image of a gradient image of the die. The mean and the standard deviation can include at least one of a Y-gradient or an X-gradient.

The method can further comprise training a predictive model with the process status; calculating an estimated parameter of a fabrication tool based on the process status; and communicating the estimated parameter to the fabrication tool.

The method can further comprise training an auto-encoder using the die images, wherein the auto-encoder is configured to determine focus and exposure skews of a fabrication tool.

In a third embodiment, a process control system is provided. The process control system comprises a processor; a storage device in electronic communication with the processor; and a communication port in electronic communication with the processor. The processor is programmed to: receive, at the communication port, a plurality of wafer images of a wafer, each wafer image having a plurality of dies; mask each of the wafer images using a segment mask to create a set of segmented die images; represent each of the dies in the set of segmented die images with a vector of feature values; calculate die metrics for each of the dies; calculate a metric of each of the wafer images based on a corresponding combination of the segment mask and the die metrics from a classifier; and determine a process status using the classifier based on the calculated metrics.

The classifier can be one of a one-class Mahalanobis classifier or a one-class Support Vector Machine (SVM) classifier.

The die metrics can include mean and standard deviation from each of the segmented die images. The die metrics can include mean and standard deviation for the segmented die image of a gradient image of the die. The mean and the standard deviation can include at least one of a Y-gradient or an X-gradient.

The processor can be further programmed to: repeat each program step for additional wafers; and refine the classifier according to the statistically significant combinations for each wafer.

DESCRIPTION OF THE DRAWINGS

For a fuller understanding of the nature and objects of the disclosure, reference should be made to the following detailed description taken in conjunction with the accompanying drawings, in which:

FIG. 3A is an exemplary flowchart of training the classifier in accordance with an embodiment of the present disclosure;

FIG. 3B is an exemplary flowchart of determining whether new data is process of record based on the process of FIG. 3A in accordance with an embodiment of the present disclosure;

DETAILED DESCRIPTION OF THE DISCLOSURE

Figure 1:
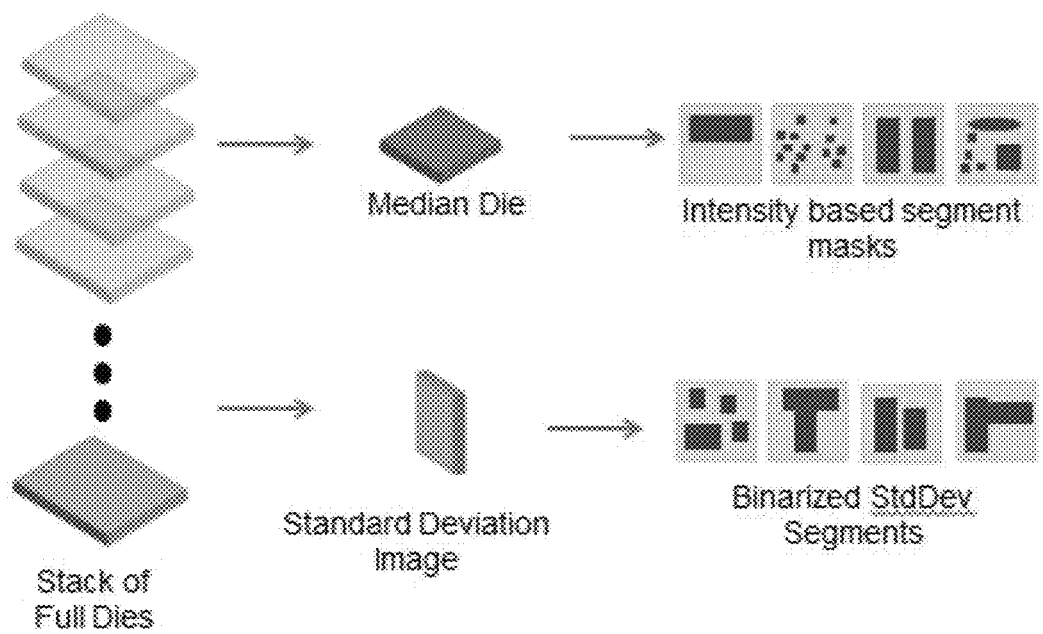
FIG. 1 is a graphic showing exemplary segmentation in accordance with an embodiment of the present disclosure.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The embodiments disclosed herein provide process window monitoring techniques based on feature extraction and classification. Wafer-level information is extracted from low frequency features, which carry much useful process information, and then is used to determine the process status of wafers. One of the advantages of the disclosed approach is its capability to detect defocus (in some cases with sub-10 nm precision) and dose modulations (i.e., energy levels (doses) used to modify the resultant photomask representation in a controlled manner such that the final image in the semiconductor device fabrication is close to an ideal image).

In production, many (if not most) of the wafers are nominal, so there may not be many examples of dies/fields where the process window failed. Therefore, having a classifier that only learns from the nominal data (good data) for predicting the process status of the new data is valuable.

Embodiments disclosed herein can quantify the process window of every wafer. Therefore, useful process information may be extracted from each wafer. To do so, each die is represented with a vector of feature values. Segmentation masks are applied per die or field to partition them into meaningful regions that can be considered together when calculating representative feature values. Segmentation can simplify the representation of the die/field into structures that are more meaningful and easier to analyze. The segmentation can be unsupervised and automatic.

Selecting features that describe the nominal class while discriminating against abnormalities from wafer-level information is a challenging task. Nominal class, normal class, or process of reference (POR) all refer to die or fields with acceptable focus, exposure, or other parameters. Features can be selected from an ensemble of wafer-level features based on ranking raw features according to statistical moments (i.e., a specific quantitative measure of the shape of a set of points); by choosing principal components with large eigenvalues; by keeping prominent independent component analysis (ICA); or by using other techniques. An eigenvector of a linear transformation is a non-zero vector that, when the transformation is applied to it, does not change direction. Applying the transformation to the eigenvector only scales the eigenvector by the scalar value $\lambda$, called an eigenvalue. These techniques can help select relevant features while removing nuisance signal from the ensemble of wafer-level information. For example, see the flowcharts of FIGS. 3A and 3B.

Features also can be selected from an ensemble of wafer-level features based on ranking raw features according to their statistical moments, such as standard deviation. Selected features can be used to train any generative model such as a one-class Mahalanobis distance classifier or a one-class Support Vector Machine (SVM) classifiers. A Mahalanobis distance classifier works by first finding the centroid of normal class samples in the selected feature space. Whether a new sample belongs to the normal class is determined by measuring its Mahalanobis distance from the centroid and comparing it to a set threshold. A one-class SVM works by finding support vectors such that a certain percent of normal examples are enclosed by the support vectors (e.g., 99% of normal examples). New samples are considered normal if they fall within the enclosure defined by support vectors. Otherwise, they are considered as outliers.

In an example, features can be selected from an ensemble of wafer-level features by choosing principal components with largest eigenvalues. Selected features then can be used to train one-class Mahalanobis or SVM classifiers.

In another example, features are selected from ensemble of wafer-level features by keeping prominent ICA. Selected features are then used to train one-class Mahalanobis or SVM classifiers.

Furthermore, "Deep Learning" techniques can be used to further define and extract new descriptive features. Instead of using heuristic features, "Deep Learning" algorithms extract features from raw nominal images. For feature selection, stack Restricted Boltzmann Machines (RBMs) or auto-encoders (e.g., Deep Learning auto-encoders) can be used. Traditional classifiers use heuristic features designed based on prior knowledge. In contrast, Deep Learning can automatically learn relevant features to minimize the difference between desired and actual outputs, thus solving an optimization problem. Deep Learning can eliminate the challenges associated finding the right heuristic. For instance, assume there are examples from multiple dies/fields with varying (unknown) doses and exposures. An auto-encoder can involve Deep Learning with a fully connected initial layer followed by a hidden layer with smaller weight(s). The final layer of auto encoder can have the same number of nodes as the input layer. The auto-encoder can be trained so that the output value Y is as close as possible as input X. In other words, auto-encoders are trained to reconstruct their own inputs with minimum loss. Once trained, the middle layer output can be viewed as lower dimensional representation of the input. An auto-encoder can be used to lower feature dimensionality similar to Principal Component Analysis (PCA) or ICA.

In an instance, the algorithm is trained by normal images to recreate the original data going through a layer that has only a few features. That layer creates the representation/features which are used to train one-class outlier detectors. A Deep Learning auto-encoder can be trained using unsupervised examples of dies and/or fields with various doses and exposures. Once trained, the auto-encoder projection can be used to map each input image to a lower dimensional feature space. These feature values now can be used to train any generative model, such as a one-class SVM classifier or a one-class Mahalanobis classifier.

To do so, each die may be represented with a vector of feature values. Segmentation masks are applied per die or field to partition the die or field into meaningful regions that can be considered together when calculating representative feature values. Usually dies/fields are made of several different structures that cannot be represented with a single value. To overcome this problem, several metrics on different structures of the die/fields can be computed by applying proper segmentation masks. The segmentation can simplify the representation of the die/field into structures that are more meaningful and easier to analyze. To establish a valid comparison between different dies, the segments may be identical. Defining the appropriate segmentation masks may be needed to obtain valuable information from the wafer. Some examples of segments on a die/fields include various functional components that are present such as memory, logic, interconnects, redistribution lines, fan outs, bumps, etc.

Segments can be obtained by analyzing several nominal dies/fields. Conceptually, these dies are stacked on top of each other to generate a "die-stack." Performing a PCA on the die-stack yields eigenvectors, which can be thresholded to yield segments consisting of pixels with high covariance. These can correspond to functional components of the die. Alternatively, the per-pixel statistics of the die-stack can be computed to yield mean, median, variance images, etc. These statistical images capture the underlying process variations. For example, pixels with high variance may indicate fluctuations in line-width due to focus changes. Low median values may indicate exposure issues. The statistical images can be thresholded directly to yield segments, or gradient and intensity features extracted from these images can be used for clustering into segments. FIG. 1 shows an example of how the segmentation is done.

To quantify the process information, each die can be characterized with a feature vector. The die is partitioned into segments. Several metrics are calculated for each segment and concatenated together to form the feature vector. The metrics include local and global statistics of pixels within the segment.

Calculating the die metrics may provide multiple representations for one product wafer, which may be needed to extract the process window information from the wafer. One or more of the following attributes that may be calculated for each segment of the die/field: mean; STD; X-Gradient3×3-Mean; X-Gradient3×3-STD; Y-Gradient3×3-Mean; Y-Gradient3×3-STD; X-Gradient5×5-Mean; X-Gradient5×5-STD; Y-Gradient5×5-Mean; and Y-Gradient5×5-STD.

Figure 2:
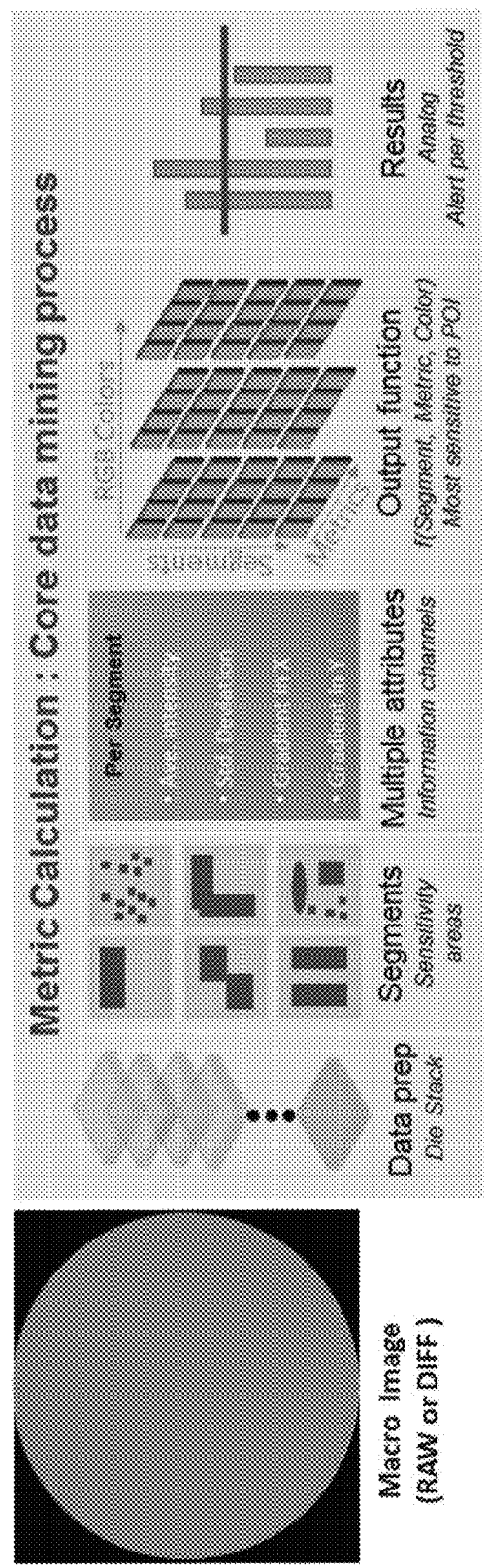
FIG. 2 is an exemplary summary of metric calculation in accordance with an embodiment of the present disclosure.

For example, X-Gradient3×3 means that that a 3×3 mask is applied to detect the X-directional gradient of the die/field. An exemplary summary of metric calculation is shown in FIG. 2.

In many data-sets, only one type of observations can be accessed. Whether a new observation belongs to the existing type of data (i.e., the observation is inlier) or not (i.e., the observation is an outlier) can be determined, for example, using the attributes that can be calculated for each segment of the die/field.

A supervised learning approach can be used to detect anomalies. In such a case, a classifier is trained using a dataset containing both normal and outlying observations. Another classification approach is semi-supervised, where the algorithm models the normal observations only. Observations that do not comply with this classifier are classified as the outliers in the testing phase. The last approach is to use unsupervised learning, where the training dataset is not labeled and it is assumed that only a small fraction of the dataset contains outlier(s). To obtain the classifier, outliers and normal data are assumed to be different.

In many practical applications, such as process window monitoring, the unsupervised learning approach is suited when no labeling information is available. Furthermore, in process window monitoring the nature of the anomalous record may be constantly changing, which makes obtaining a training dataset that accurately describes anomalies difficult, if not impossible. For example, the anomaly can be caused by defocus, exposure skew, different CMP thickness, etc.

One-class SVMs try to learn a decision boundary that achieves the maximum separation between the points and the origin. A one-class SVM utilizes an implicit transformation function defined by the kernel (i.e., a similarity function over pairs of data points in raw representation) to project the data into a higher dimensional space. The algorithm then learns a hyper plane (also known as the decision boundary) that separates the majority of the data from the origin. Only a small fraction of data points are allowed to lie on the other side of the decision boundary (i.e., are considered as outliers). This technique can be used to separate nominal data from any other data. This technique may be particularly useful because it may be difficult to predict what will go wrong, but detection that the coming data is not nominal can allow a manufacturer to investigate any potential issues at an early stage. FIGS. 3A and 3B show training and applying the outlier detection classifier. The classifier can be, for example, a one-class SVM classifier or another type of classifier.

Selecting a reasonable number of relevant features from a large number of wafer level heuristic features may be a challenging task. A systematic method to select relevant features for abnormality detection while trying to minimize nuisance signal can be applied.

Relevant features can be selected from ensemble of features by statistical analysis of the features. For example, features can be ranked based on their statistical moments, such as their standard deviations. In another example, PCA and ICA can be employed to identify prominent components best describing the signal. Selected features are then used to train one-class Mahalanobis or SVM classifiers.

The algorithm can be trained by normal images to recreate the original data going through a layer that has only a few features. That layer creates the representation/features which are used to train one-class outlier detectors. "Deep Learning" algorithms can extra features from raw nominal images and stack or auto-encoders (Deep Learning auto-encoders) can be used for feature selection.

Figure 4:
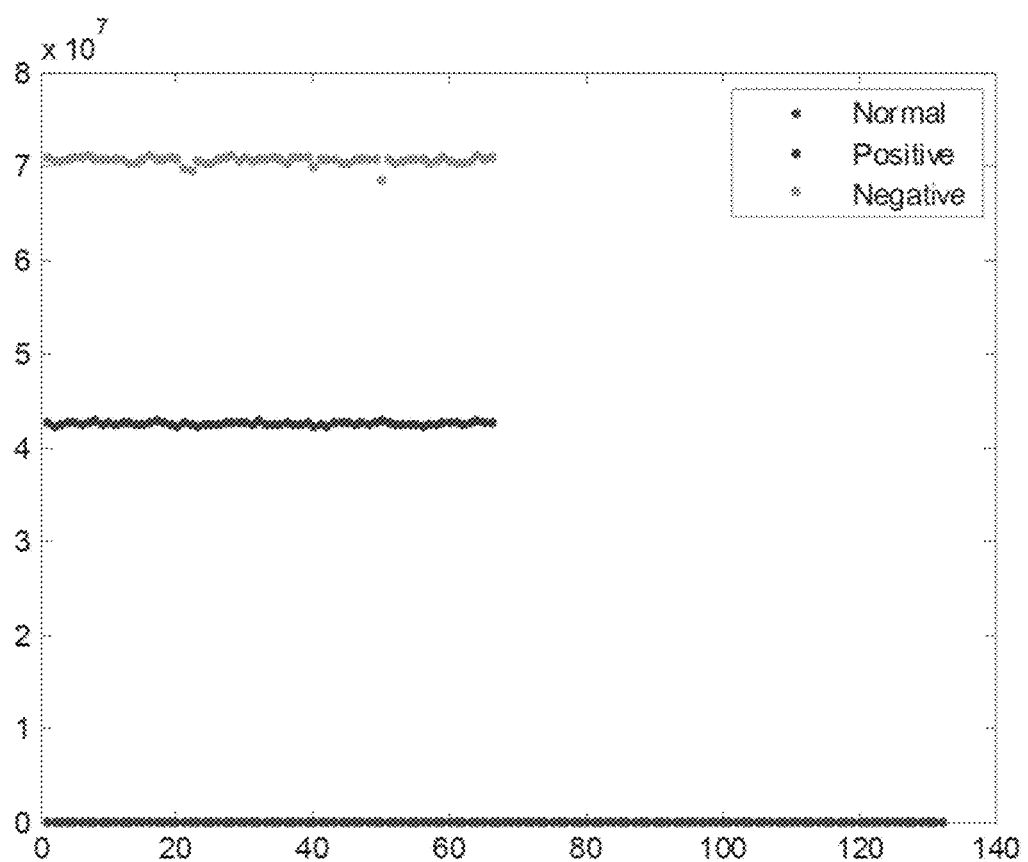
FIG. 4 is a chart showing an example of Mahalanobis distances from the centroid of normal-class training examples for various never-seen-before samples with positive, negative, and nominal defocuses.
Figure 5A:
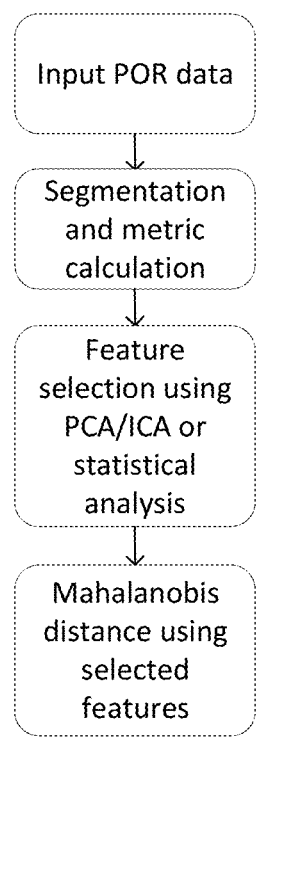
FIG. 5A is an exemplary flowchart of distance calculation in accordance with an embodiment of the present disclosure.
Figure 5B:
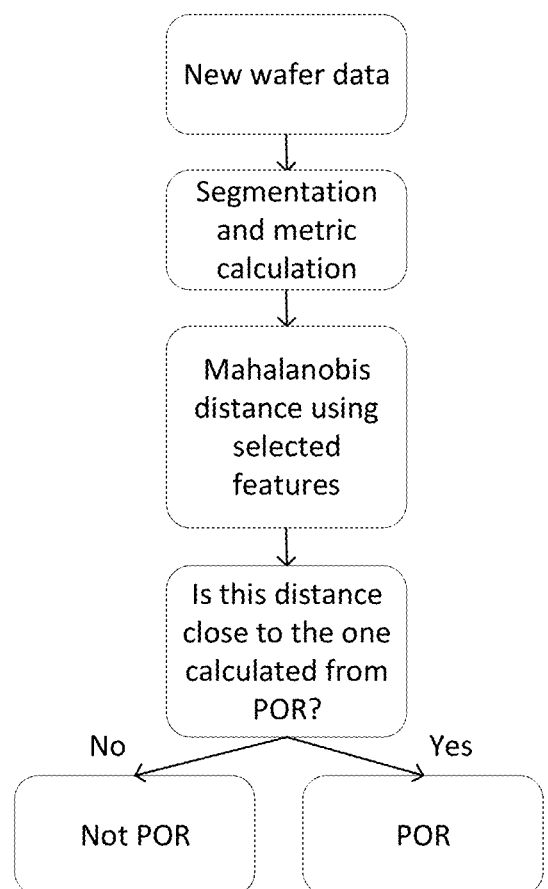
FIG. 5B is an exemplary flowchart of determining whether new data is process of record based on the process of FIG. 5A in accordance with an embodiment of the present disclosure.

PCA can be applied to raw features from normal class. For example, principle components contributing to 90% of variation in normal class signal are identified. These principle components can be used to project all the raw features from high-dimensional feature space to lower-dimensional PCA space. Using the training data from normal class only, a Mahalanobis Distance classifier can be trained. New samples under inspection now can be classified based on their Mahalanobis distance to the centroid of a training cluster in the PCA space. FIG. 4 shows Mahalanobis distances from the centroid of normal-class training examples for various never-seen-before samples with positive, negative, and nominal defocuses. The positive and negative defocus samples can be identified by using correct threshold values. FIGS. 5A and 5B summarize an embodiment of the method described herein.

Each of the steps of the method may be performed as described further herein. The methods may also include any other step(s) that can be performed by the image acquisition subsystem and/or computer subsystem(s) or system(s) described herein. The steps are performed by one or more computer systems, which may be configured according to any of the embodiments described herein. In addition, the methods described above may be performed by any of the system embodiments described herein.

Figure 6:
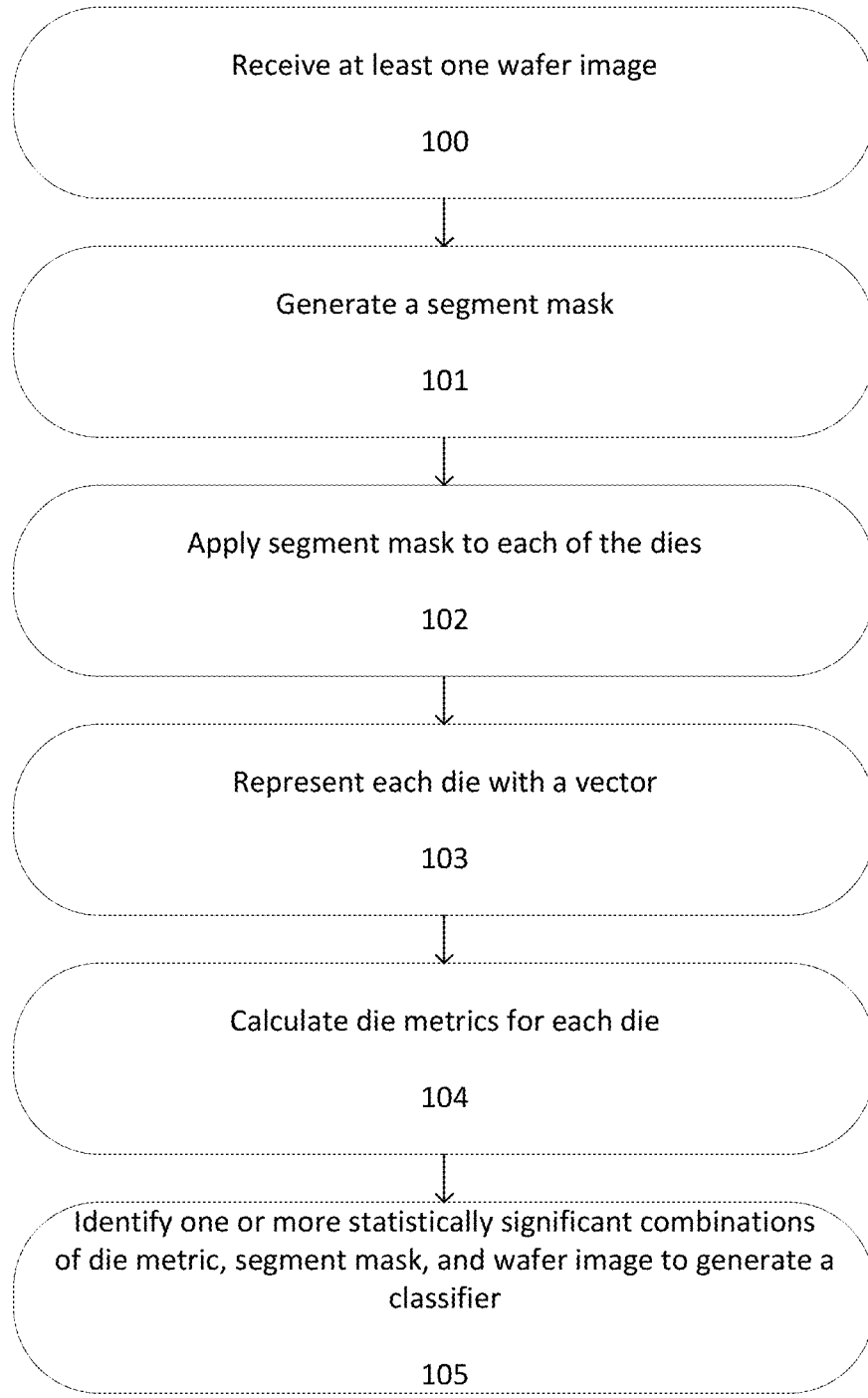
FIG. 6 is a flowchart showing a method of generating a classifier in accordance with an embodiment of the present disclosure.

The present disclosure may be embodied as a method for generating a classifier, as seen in FIG. 6. The method comprises receiving 100 at least one wafer image. The wafer image can include a set of die images. More than one wafer image may be provided. Each image can be captured using the same or a different modality such as, for example, bright field illumination, dark field illumination, polarized light, red light, blue light, green light, white light, etc., or combinations thereof.

For each wafer, a segment mask is generated 101. This can be based on the median die of the wafer and based on the standard deviation of the wafer. The segment mask can be, for example, a 3×3 or 5×5 mask.

Using a processor, the segment mask is applied 102 to each of the die images. Segment masks allow each image (wafer and/or die) to be masked to show only the portion of the image having potentially useful information (i.e., signal) while masking information that is potentially less useful (i.e., noise). It should be noted that different structures in the die are capable of carrying different levels of process information. Significant amounts of process information are generally hidden in the data as these structures are inspected with the combinations of optical parameters. This rich process information can be extracted by applying the types of analysis disclosed herein. An aspect of this analysis is the segmentation of the different kinds of structures in the die into various groups. The signal is accumulated within each group to further enhance the signal to noise ratio.

Each of the dies is represented 103 with a vector of feature values. Die metrics are calculated 104 for each die. Die metrics can include mean and standard deviation from each segment of the die. Die metrics also can include mean and standard deviation for each segment of a gradient image of the die. Each segment of the gradient image of the die can include at least one of a Y-gradient or an X-gradient.

Using a processor, one or more statistically significant combinations of die metric, segment mask, and wafer image are identified 105 to generate a classifier. Identification 105 may be based on the die inspection results.

Figure 7:
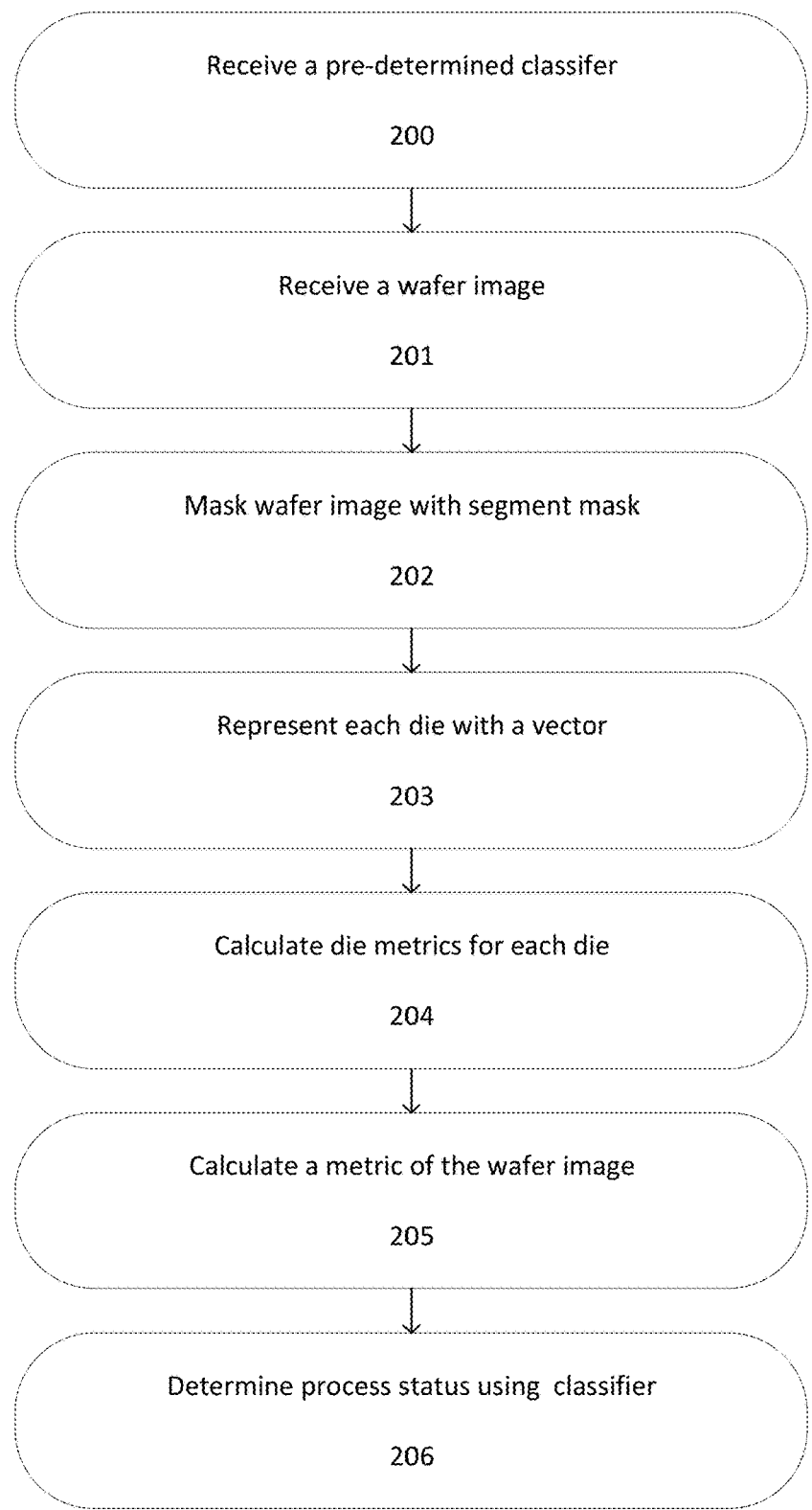
FIG. 7 is a flowchart showing a process control method in accordance with an embodiment of the present disclosure.

The present disclosure may be embodied as a method of process control, as seen in FIG. 7. The method comprises receiving 200 a pre-determined classifier. For example, this classifier may be determined using the process of FIG. 6. The classifier may be based on combinations of metrics of masked die images. A wafer image comprising a set of die images is received 201. The wafer image is masked 202 using a segment mask. The segment mask can be, for example, a 3×3 or a 5×5 mask.

Each of the dies in the set of die images is represented 203 with a vector of feature values. Die metrics are calculated 204 for each of the dies. The dies may be segmented. The die metrics can include mean and standard deviation from each segment of the die. The die metrics also can include mean and standard deviation for each segment of a gradient image of the die. The mean and the standard deviation for each segment of the gradient image of the die can include at least one of a Y-gradient or an X-gradient.

A metric of the wafer image is calculated 205 based on a corresponding combination of the segment mask and the die metrics from the classifier. This wafer image may be a masked image.

A process status is determined 206 using the classifier based on the calculated metrics to detect a compliance or non-compliance status of the process. The classifier can be one of a Mahalanobis classifier or an SVM classifier. Other classifiers are possible.

The process status may be a simple pass/fail indication for each die or each wafer. In other embodiments, the process status may indicate pass or fail, and further indicate one or more reasons for the failure. For example, for a lithography module (a production tool used for lithography), a die may fail due to alignment, fidelity, focus, reticle tilt, critical dimension, overlay, particles, etc. In a CMP module, failure may be due to polishing defects, contamination, scratches, etc. In a deposition module, failure may be due to alignment, contamination, film thickness, etc. Other failure types are known and can be incorporated. As such, embodiments of the method disclosed herein may be used to generate a classifier having multiple classes (e.g., pass, alignment failure, or scratched, which is a three-class classifier). In general, this classifier can also be of the regression type where a discrete model can be replaced with a continuous model.

In an instance, a Deep Learning auto-encoder can be trained using unsupervised examples of dies and/or fields with various dose and exposures and these feature values now can be used to train any generative model, such as a one-class SVM classifier or a one-class Mahalanobis classifier.

While the method may be used to detect problems once they have occurred, the method may also be used to detect impending signs of problems before they occur. The method is not specific to any single class of process problems. Embodiments of the present technique have a universality such that the technique can be applied across any or all process modules in a semiconductor manufacturing facility.

In an instance, the die metrics, process status, or other information generated using, for example, the method of FIG. 7 can be used to train predictive models such as regression, deep learning, or neural networks to calculate estimate parameters of a fabrication tool. For example, the predictive model can be trained to calculate the actual amount of exposure or defocus. The estimated parameters can be communicated to a fabrication tool to improve performance of the fabrication tool.

Steps of the methods of FIG. 6 or FIG. 7 may be repeated for additional wafer images in order to refine the classifier. For example, the steps may be repeated for additional wafer images having different image modalities than the image modalities previously used in the method. In this way, the resulting classifier can be improved where additional statistically significant combinations are found. In another example, the steps may be repeated for additional wafer images with the same modalities of previously-used images. For example, the additional images are images of additional wafers that were not previously used in the method. As such, the resulting classifier can be improved through the use of additional data points. In this way, a device using the method of FIG. 6 or FIG. 7 in a manufacturing environment can continuously improve its classifier.

Using embodiments disclosed herein, an algorithm can segment wafer-level images. This segmentation may be automatic. Single or multiple wafers/lots can be combined for robustness. An outlier detection algorithm can learn from controlled nominal wafers or lots to predict the process status of new wafers. Descriptive features can be automatically selected from numerous raw features by using a class (i.e., the nominal class). Defocus or dose skew data may not be required. Instead, nominal data may be all that is needed. Local process window margins per reticle can be mapped.

The embodiments disclosed herein, early detection of problems with a process tool can be achieved even before the process tool begins causing defects on wafers. This can allow for scheduling of downtime without loss of wafers or materials.

Embodiments disclosed herein can be run in conjunction with high-resolution defect detection modules.

In process window monitoring, the nature of anomalous record is usually changing constantly (e.g., defocus, exposure skew, different CMP thickness). The ability to separate process of record (POR) data from non-POR data, such as using the embodiments disclosed herein, is useful. A specific signal, like defocus or exposure skew, can be automatically detected. Automated outlier detection can be used to determine the process status of a new wafer.

Often, there are more examples of one class (e.g., good/acceptable examples) than another class (e.g., abnormalities). The degree and source of abnormality can vary and it may not be possible to collect representative examples from each possible variation. Learning variations in the normal class and detecting variations beyond acceptable norms, as disclosed herein, can be advantageous.

The embodiments disclosed herein can be applied to different manufacturing applications. For example, the embodiments disclosed herein can be applied to defocus and dose lithography applications or to film thickness monitoring for CMP and film modules.

In an example, individual dies are inspected on multiple wafers. The features in this example may be based on wires or other interconnects and can include mean, standard deviation, contrast, or other values. Features per die is a multi-dimensional value. Standard deviation of the die can have a sphere or ellipsoid distribution. In this instance, most of the features fall within normal fields and, for example, 99% of data falls within a multidimensional sphere. Based on this distribution, a classifier, such as an SVM classifier, learns what is normal. A classifier can be built based on the existing data. Additional wafers are compared to this normal distribution in the classifier, which determines what is good or normal on the additional wafers. Inside the 3D space (i.e., the multidimensional sphere) is normal, whereas outside the 3D space is not.

Figure 8:
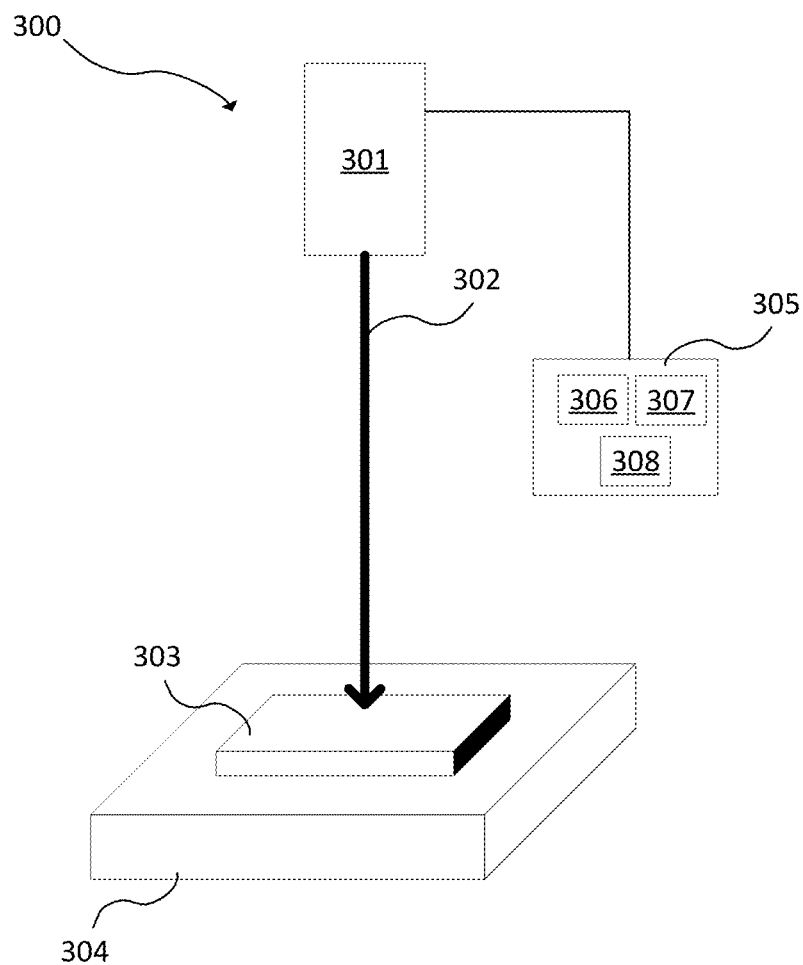
FIG. 8 is a block diagram of a process control system in accordance with the present disclosure.

FIG. 8 is a block diagram of a process control system 300. The process control system 300 may be or otherwise include an SEM, another inspection tool that uses an electron beam, another inspection tool that uses a light beam, or other equipment configured to inspect wafers.

The process control system 300 includes a stage 304 configured to clamp a wafer 303. The stage 304 may be configured to move or rotate in one, two, or three axes.

The process control system 300 also includes an imaging device 301 configured to generate an image of a surface of the wafer 303. The image may be for a particular layer of the wafer 303. In this example, the imaging device 301 produces a beam 302 to generate an image of the wafer 303. The beam 302 may be, for example, an electron beam or a light beam. Other imaging devices 301 are possible, such as those that use broad band plasma.

As used herein, the term "wafer" generally refers to substrates formed of a semiconductor or non-semiconductor material. Examples of such a semiconductor or non-semiconductor material include, but are not limited to, monocrystalline silicon, gallium nitride, gallium arsenide, indium phosphide, sapphire, and glass. Such substrates may be commonly found and/or processed in semiconductor fabrication facilities.

A wafer may include one or more layers formed upon a substrate. For example, such layers may include, but are not limited to, a photoresist, a dielectric material, a conductive material, and a semiconductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features or periodic structures. Formation and processing of such layers of material may ultimately result in completed devices. Many different types of devices may be formed on a wafer, and the term wafer as used herein is intended to encompass a wafer on which any type of device known in the art is being fabricated.

The process control system 300 communicates with a controller 305. For example, the controller 305 can communicate with the imaging device 301 or other components of the process control system 300. The controller 305 can include a processor 306, a storage device 307 in electronic communication with the processor 306, and a communication port 308 in electronic communication with the processor 306. It is to be appreciated that the controller 305 may be implemented in practice by any combination of hardware, software, and firmware. For example, the communication port 308 may be a network port, such as an Ethernet port or a wireless Ethernet port. Also, its functions as described herein may be performed by one unit, or divided up among different components, each of which may be implemented in turn by any combination of hardware, software and firmware. Program code or instructions for the controller 305 to implement the various methods and functions described herein may be stored in controller readable storage media, such as a memory, within the controller 305, external to the controller 305, or combinations thereof.

In an instance, the communication port 308 may be, for example, a serial interface to the imaging device 301. The imaging device 301 can include an imaging sensor. The imaging sensor may be, for example, a charge-coupled device (CCD) or a time delay and integration (TDI) sensor. The imaging device 301 may further comprise an illumination source. The illumination source may be configured as a bright-field source or a dark-field source, as is known in the art. The illumination source may be a broad-spectrum source, such as a white light source, or a more narrow-spectrum source, such as a red light, blue light, or green light source. The imaging device 301 may be configured to capture images using polarized light. The imaging device 301 may comprise more than one illumination sources such that the process control system 300 may take advantage of images having different modalities. Other imaging modalities and imaging device 301 configurations are known and will be apparent in light of the present disclosure. The imaging device 301 is configured to capture an image of a wafer. For example, the wafer image may be captured while a wafer is being transported through the process control device 300.

The controller 305 also may identify abnormalities on a wafer 303 or detect compliance/non-compliance of a manufacturing process. For example, the controller 305 may perform the steps of FIG. 6 or FIG. 7. The controller 305 also may perform other steps or techniques disclosed herein.

The controller 305 may be coupled to the detectors of the process control system 300 in any suitable manner (e.g., via one or more transmission media, which may include "wired" and/or "wireless" transmission media) such that the controller 305 can receive the output generated by the detectors, such as those in the imaging device 301. The controller 305 may be configured to perform a number of functions using the output of the detectors. For instance, the controller 305 may be configured to detect defects on the wafer 303 using the output of the detectors. Detecting the defects on the wafer 303 may be performed by the controller 305 by applying some process control or compliance algorithm and/or method to the output generated by the detectors. The algorithm and/or method may include any suitable algorithm and/or method disclosed herein or known in the art. For example, the controller 305 may compare the output of the detectors to a threshold. Any output having values above the threshold may be identified as non-compliant, while any output having values below the threshold may be identified as compliant. In another example, the controller 305 may be configured to send the output of the detectors to a storage device 307 or another storage medium without performing defect detection on the output. The controller 305 may be further configured as described herein.

The controller 305, other system(s), or other subsystem(s) described herein may take various forms, including a personal computer system, image computer, mainframe computer system, workstation, network appliance, internet appliance, or other device. In general, the term "controller" may be broadly defined to encompass any device having one or more processors, which executes instructions from a memory medium. The subsystem(s) or system(s) may also include any suitable processor known in the art such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

An additional embodiment relates to a non-transitory computer-readable medium storing program instructions executable on a controller for performing a computer-implemented method for identifying abnormalities on a wafer or detecting compliance/non-compliance, as disclosed herein. In particular, as shown in FIG. 8, storage device 307 or other storage medium may contain non-transitory computer-readable medium that includes program instructions executable on the controller 305. The computer-implemented method may include any step(s) of any method(s) described herein.

Program instructions implementing methods such as those described herein may be stored on computer-readable medium, such as in the storage device 307 or other storage medium. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Controller 305 may be configured according to any of the embodiments described herein. In an instance, the processor 306 is programmed to perform any of the methods described herein. In an example, the processor 306 is programmed to receive at least one wafer image. The wafer image can include a set of die images. The processor 306 is programmed to generate a median die of a wafer and a standard deviation of the wafer based on the set of die images. For each wafer, the processor 306 is programmed to generate a segment mask based on the median die of the wafer and based on the standard deviation of the wafer. The processor 306 is programmed to apply the segment mask to each of the die images to create segmented die images for each of the die images. The processor 306 is programmed to represent each of the dies with a vector of feature values. The processor 306 is programmed to calculate die metrics for each die based on the vector. The process 306 is programmed to identify one or more statistically significant combinations of die metric, segment mask, and wafer image to generate a classifier.

In another instance, the processor 306 is programmed to receive a pre-determined classifier capable of detecting a process non-compliance. The classifier can be based on combinations of metrics of masked die images. The processor 306 is programmed to receive a wafer image comprising a set of die images. The processor 306 is programmed to mask the wafer image using a segment mask and to represent each of the dies in the set of die images with a vector of feature values. The processor 306 is programmed to calculate die metrics for each of the dies. The processor 306 is programmed to calculate a metric of the wafer image based on a corresponding combination of the segment mask and the die metrics from the classifier. The processor 306 is programmed to determine a process status using the classifier based on the calculated metrics. The classifier can be one of a Mahalanobis classifier or a SVM classifier. Other classifiers are possible.

In another instance, the processor 306 is programmed to receive a plurality of wafer images of a wafer. Each wafer image has a plurality of dies. The processor 306 is programmed to mask each of the wafer images using a segment mask to create a set of segmented die images; represent each of the dies in the set of segmented die images with a vector of feature values; calculate die metrics for each of the dies; calculate a metric of each of the wafer images based on a corresponding combination of the segment mask and the die metrics from a classifier; and determine a process status using the classifier based on the calculated metrics.

Techniques disclosed herein can be used as a feedback mechanism to adjust a processing tool, such as a CMP tool or to provide a notification that the processing tool requires maintenance. As such, the processor 306 may send instructions to a processing tool by way of the communication port 308. Additionally or alternatively, the processor 306 may send a maintenance notification signal by way of the communication port 308 or otherwise (e.g., an alarm device, etc.). In some embodiments, the process control system 300 may comprise transport mechanism capable of routing wafers for rework or scrap. In such embodiments, the processor 306 may be programmed to route a wafer for rework or scrap.

While disclosed as part of a process control system, the controller 305 described herein may be configured for use with inspection systems. In another embodiment, the controller 305 described herein may be configured for use with a metrology system. Thus, the embodiments of as disclosed herein describe some configurations for classification that can be tailored in a number of manners for systems having different imaging capabilities that are more or less suitable for different applications.

The embodiments disclosed herein also may be configured for inspection, defect review, and metrology of other specimens, such as reticles. For example, the embodiments described herein may be configured for the purposes of mask inspection, wafer inspection, and wafer metrology. In particular, the embodiments described herein may be installed on a computer node or computer cluster that is a component of or coupled to an output acquisition subsystem such as a broadband plasma inspector, an electron beam inspector or defect review tool, a mask inspector, a virtual inspector, etc. In this manner, the embodiments described herein may generate output that can be used for a variety of applications that include, but are not limited to, wafer inspection, mask inspection, electron beam inspection and review, metrology, etc. The controller can be modified as described above based on the specimen for which it will generate actual output.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method for generating a classifier comprising:
   generating at least one wafer image using an imaging device that produces a beam, the wafer image comprising a set of die images;
   generating, using a processor, a median die of a wafer and a standard deviation of the wafer based on the set of die images;
   generating, using the processor, a segment mask based on the median die of the wafer and based on the standard deviation of the wafer;
   applying, using the processor, the segment mask to each of the die images to create a plurality of segmented die images for each of the die images;
   representing, using the processor, each of the dies with a vector of feature values, wherein the feature values are of wafer-level features of the wafer image;
   calculating, using the processor, die metrics for each of the die images based on the vector; and
   identifying, using the processor, one or more statistically significant combinations of the die metrics, the segment mask, and the wafer image to generate a classifier.

2. The method of claim 1, wherein the die metrics include mean and standard deviation for each of the segmented die images.

3. The method of claim 1, wherein the die metrics include mean and standard deviation for the segmented die image of a gradient image of the die.

4. The method of claim 3, wherein the mean and the standard deviation for each of the segmented die images include at least one of a Y-gradient or an X-gradient.

5. The method of claim 1, wherein the classifier is a one-class Mahalanobis classifier.

6. The method of claim 1, wherein the classifier is a one-class Support Vector Machine (SVM) classifier.

7. A process control method comprising:
receiving a pre-determined classifier capable of detecting a process non-compliance, wherein the classifier is based on combinations of metrics of masked die images;
generating a wafer image comprising a set of die images using an imaging device that produces a beam;
masking the wafer image using a segment mask;
representing, using a processor, each of the dies in the set of die images with a vector of feature values, wherein the feature values are of wafer-level features of the wafer image;
calculating, using the processor, die metrics for each of the dies;
calculating, using the processor, a metric of the wafer image based on a corresponding combination of the segment mask and the die metrics from the classifier; and
determining, using the processor, a process status using the classifier based on the calculated metrics.

8. The method of claim 7, wherein the classifier is a one-class Mahalanobis classifier.

9. The method of claim 7, wherein the classifier is a one-class Support Vector Machine (SVM) classifier.

10. The method of claim 7, wherein the die metrics include mean and standard deviation for a segmented die image.

11. The method of claim 7, wherein the die metrics include mean and standard deviation for the segmented die image of a gradient image of the die.

12. The method of claim 11, wherein the mean and the standard deviation include at least one of a Y-gradient or an X-gradient.

13. The method of claim 7, further comprising:
training a predictive model with the process status;
calculating an estimated parameter of a fabrication tool based on the process status; and
communicating the estimated parameter to the fabrication tool.

14. The method of claim 7, further comprising training an auto-encoder using the die images, wherein the auto-encoder is configured to determine focus and exposure skews of a fabrication tool.

15. A process control system comprising:
an imaging device that produces a beam, wherein the imaging device is configured to generate a plurality of images of a surface of a wafer;
a processor;
a storage device in electronic communication with the processor; and
a communication port in electronic communication with the processor and the imaging device;
wherein the processor is programmed to:
receive, at the communication port, the plurality of wafer images of the wafer, each wafer image having a plurality of dies;
mask each of the wafer images using a segment mask to create a set of segmented die images;
represent each of the dies in the set of segmented die images with a vector of feature values, wherein the feature values are of wafer-level features of the wafer image;
calculate die metrics for each of the dies;
calculate a metric of each of the wafer images based on a corresponding combination of the segment mask and the die metrics from a classifier; and
determine a process status using the classifier based on the calculated metrics.

16. The process control system of claim 15, wherein the classifier is one of a one-class Mahalanobis classifier or a one-class Support Vector Machine (SVM) classifier.

17. The process control system of claim 15, wherein the die metrics include mean and standard deviation from each of the segmented die images.

18. The process control system of claim 15, wherein the die metrics include mean and standard deviation for the segmented die image of a gradient image of the die.

19. The process control system of claim 18, wherein the mean and the standard deviation include at least one of a Y-gradient or an X-gradient.

20. The process control system of claim 15, wherein the processor is further programmed to:
repeat each program step for additional wafers; and
refine the classifier according to the statistically significant combinations for each wafer.

* * * * *